United States Patent
Lee

(10) Patent No.: US 8,263,997 B2
(45) Date of Patent: Sep. 11, 2012

(54) METHOD FOR FORMING OHMIC ELECTRODE AND SEMICONDUCTOR LIGHT EMITTING ELEMENT

(75) Inventor: Jong-Lam Lee, Pohang (KR)

(73) Assignees: Seoul Opto Device Co., Ltd., Ansan-si (KR); Postech Foundation, Pohang-si (KR)

( * ) Notice: Subject to any disclaimer, the term of this patent is extended or adjusted under 35 U.S.C. 154(b) by 695 days.

(21) Appl. No.: 12/296,356

(22) PCT Filed: Apr. 18, 2007

(86) PCT No.: PCT/KR2007/001898
§ 371 (c)(1),
(2), (4) Date: Oct. 7, 2008

(87) PCT Pub. No.: WO2007/120016
PCT Pub. Date: Oct. 25, 2007

(65) Prior Publication Data
US 2009/0134418 A1    May 28, 2009

(30) Foreign Application Priority Data
Apr. 18, 2006  (KR) .................. 10-2006-0035088

(51) Int. Cl.
*H01L 33/00* (2010.01)
(52) U.S. Cl. ................ 257/99; 438/624; 438/540
(58) Field of Classification Search ............ 257/99; 438/624, 540
See application file for complete search history.

(56) References Cited

U.S. PATENT DOCUMENTS

| 7,009,218 B2 * | 3/2006 | Sugimoto et al. ........... 257/99 |
| 2006/0043384 A1 * | 3/2006 | Cho et al. ................ 257/79 |
| 2007/0181906 A1 * | 8/2007 | Chik et al. .............. 257/103 |

FOREIGN PATENT DOCUMENTS

| JP | 2000-036619 | 2/2000 |
| JP | 2003-051613 | 2/2003 |
| JP | 2005-167237 | 6/2005 |

(Continued)

OTHER PUBLICATIONS 10-2005-0075076 Korean Patent Translation of Provided Korean Patent.*

(Continued)

*Primary Examiner* — Jerome Jackson, Jr.
*Assistant Examiner* — Dale E Page
(74) *Attorney, Agent, or Firm* — H.C. Park & Associates, PLC

(57) ABSTRACT

The present invention relates to a method of forming an ohmic electrode in a semiconductor light emitting element, comprising: forming a semiconductor layer having a light emitting structure on a substrate, sequentially laminating a bonding layer, a reflective layer and a protective layer on the semiconductor layer, and forming an ohmic electrode by performing a heat treatment process to form ohmic bonding between the semiconductor layer and the bonding layer and to form an oxide film on at least a portion of the protective layer; and a semiconductor light emitting element using the ohmic electrode. According to the present invention, since a reflective layer is formed of Ag, Al and an alloy thereof with excellent light reflectivity, the light availability is enhanced. Further, since contact resistance between a semiconductor layer and a bonding layer is small, it is easy to apply large current for high power.

18 Claims, 4 Drawing Sheets

FOREIGN PATENT DOCUMENTS

| JP | 2005-260245 | 9/2005 |
|---|---|---|
| JP | 2006-074042 | 3/2006 |
| KR | 10-2002-0031683 | 5/2002 |
| KR | 10-2005-0075076 | 7/2005 |
| WO | 2005/069389 | 7/2005 |

OTHER PUBLICATIONS

Non-Final Office Action of U.S. Appl. No. 13/102,589 dated Apr. 17, 2012.

* cited by examiner

[Fig. 1]
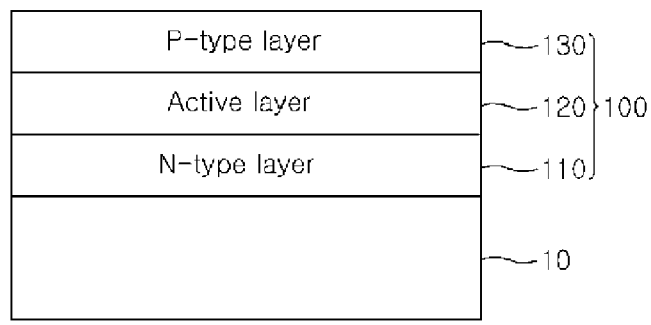
[Fig. 2]
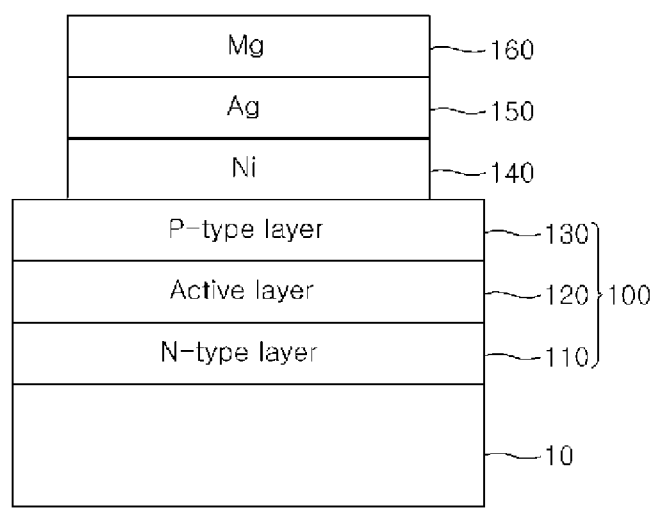
[Fig. 3]
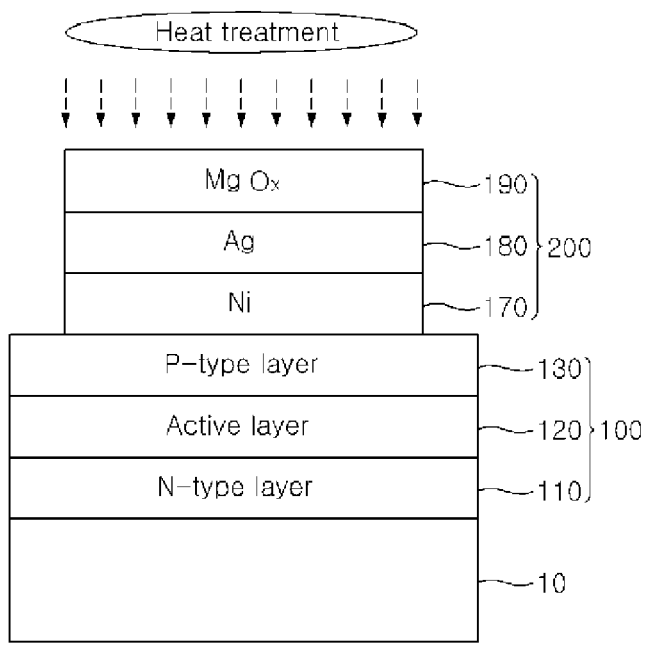

[Fig. 4]
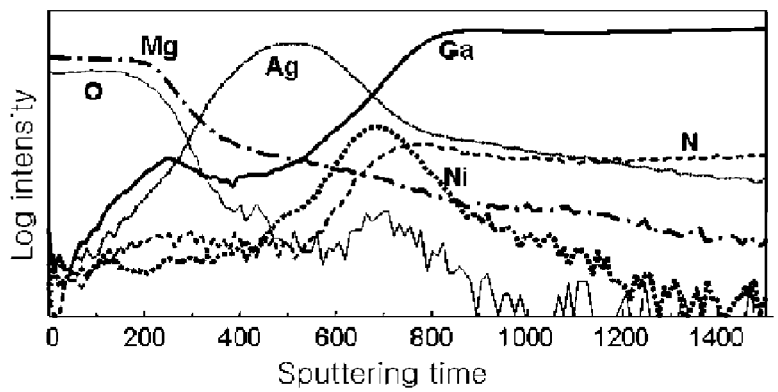
[Fig. 5]
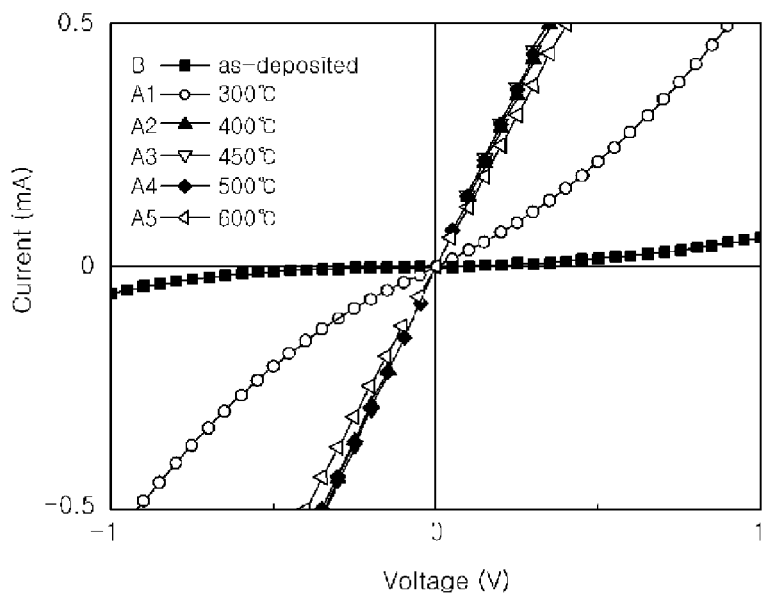
[Fig. 6]
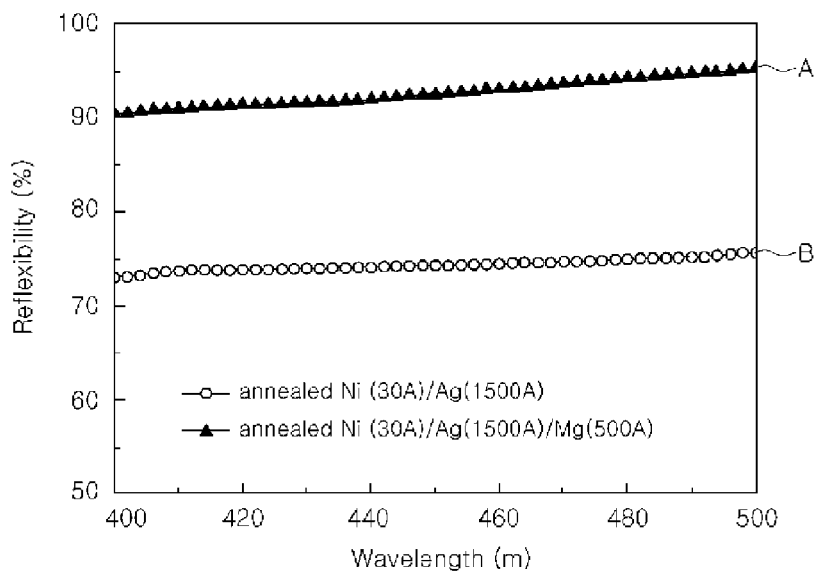

[Fig. 7]
(a)          (b)
[Fig. 8]
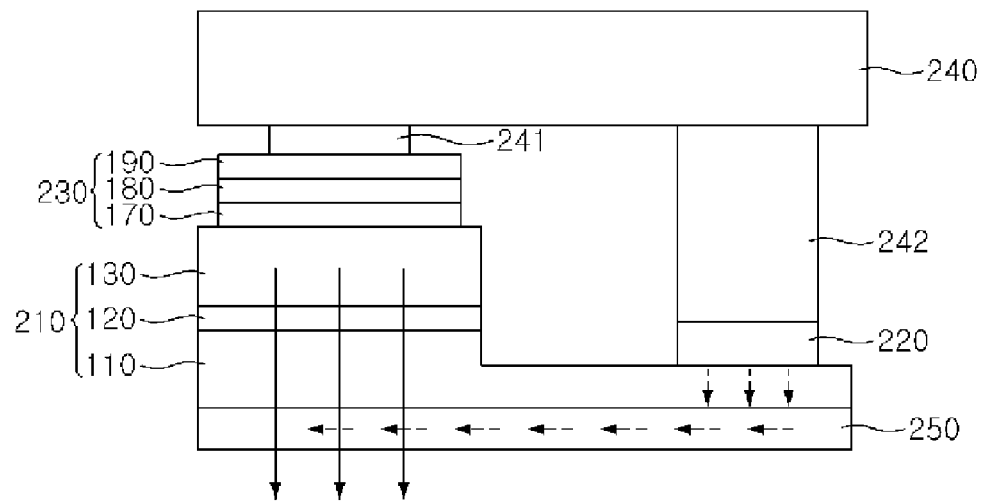
[Fig. 9]
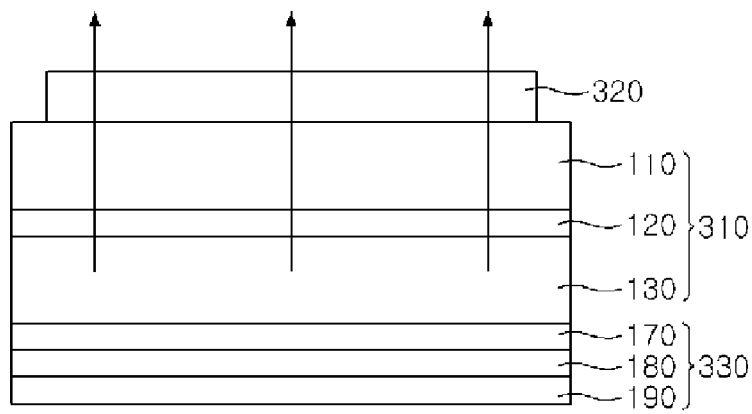

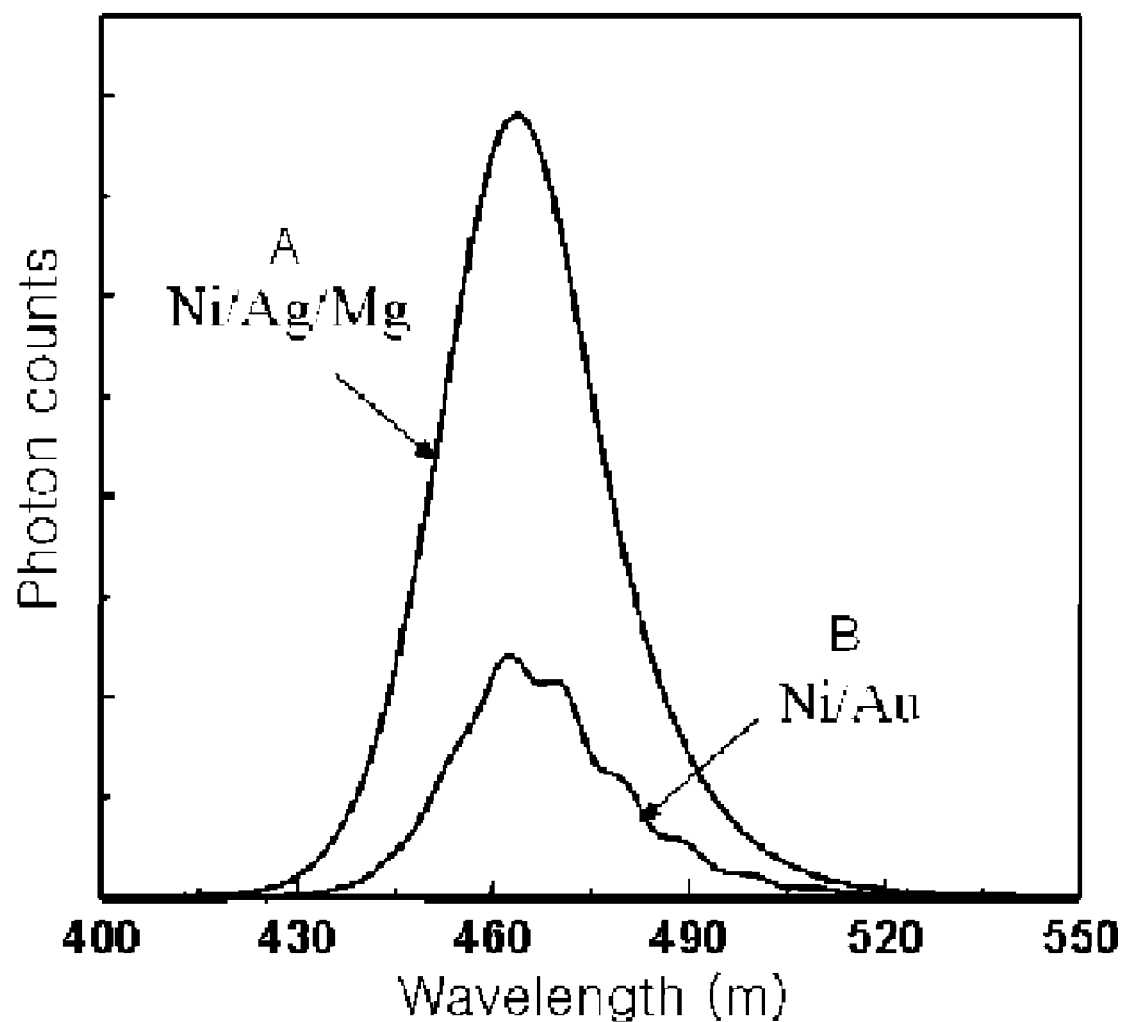
[Fig. 10]

METHOD FOR FORMING OHMIC ELECTRODE AND SEMICONDUCTOR LIGHT EMITTING ELEMENT

CROSS REFERENCE TO RELATED APPLICATIONS

This application is the National Stage of International Application No. PCT/KR07/001,898, filed on Apr. 18, 2007, and claims priority from and the benefit of Korean Patent Application No. 10-2006-0035088, filed on Apr. 18, 2006, which are both hereby incorporated by reference for all purposes as if fully set forth herein.

BACKGROUND OF THE INVENTION

1. Field of the Invention

The present invention relates to a method of forming an ohmic electrode and a semiconductor light emitting element, and more particularly, to a method of forming an ohmic electrode formed on a semiconductor layer to allow a current applied thereto, and a semiconductor light emitting element using the ohmic electrode.

2. Discussion of the Background

Semiconductor light emitting elements have advantages of small size, lightweight, low power consumption and long life span, and do not require preheating time and complicated driving circuits. Further, since the semiconductor light emitting elements are strong in shock and vibration and can be packaged into various shapes, the semiconductor light emitting elements is expected to substitute for backlights of large-sized liquid crystal displays, general illumination and light sources for vehicle headlights within next few years.

Particularly, since a nitride-based semiconductor light emitting element has excellent characteristics of electron affinity, electron mobility, electron saturation velocity and electric field breakdown voltage, high efficiency and high power can be implemented. Since the nitride-based semiconductor light emitting element does not contain harmful substance such as As or Hg, it has been noticed as an environment-friendly element.

In general, a nitride semiconductor light emitting element is fabricated by sequentially laminating a nitride-based n-type layer, a nitride-based active layer and a nitride-based p-type layer on a sapphire substrate, and then arranging two electrodes horizontally so as to apply power to the n-type and p-type layers. Such a light emitting element with a horizontal structure is relatively simple in a fabrication process and thus is inexpensive, while it is difficult to implement high power. That is, since light generated from the active layer is absorbed in the two electrodes and thus is not emitted to the outside, the high power cannot be implemented. There is also a problem in that since a sapphire substrate has a low thermal conductivity and thus heat generated in an operation process is not effectively emitted, the thermal stability lowers.

In order to solve such a problem, a light emitting element with a vertical structure and a flip-chip type light emitting element have been suggested. In this case, a reflective layer is formed on any one electrode to allow light generated from an active layer to be easily emitted to the outside, whereby the light availability can be enhanced. Further, a metal substrate with excellent thermal conductivity is used in place of a sapphire substrate, whereby the thermal stability can be enhanced.

However, nitride semiconductor light emitting elements that have been developed up to now are still unsatisfactory in view of high power, light emitting efficiency and price, and their performance should be more improved. Particularly, in order for the light emitting elements to substitute for conventional mercury lamps and fluorescent lamps, a problem of high power and thermal stability in accordance therewith should be solved.

Meanwhile, in order to obtain higher power, the development of an electrode with a high light reflectivity should be preceded. Since a metal such as Al or Ag is excellent in a visible region in view of light reflectivity, an excellent characteristic of light output can be obtained by using such a metal as an electrode. However, since Al has large contact resistance with a nitride-based semiconductor layer, it is difficult to apply large current. Since Ag has lower contact resistance but has poor interlayer adhesive strength and low thermal stability, there is a problem in that agglomeration, interface voids and the like are formed during heat treatment.

Due to such problems, Au- or Pt-based electrodes used for light emitting elements with a horizontal structure have still been used for light emitting elements with a vertical structure. Therefore, there is a limit in that light output is secured to the extent that the light emitting elements substitute for conventional white light sources. Further, since the Au or Pt, which is a conventional electrode material, is expensive, there is a problem in that the fabrication cost is increased.

SUMMARY OF THE INVENTION

The present invention is to provide a method for forming an ohmic electrode, wherein a reflective layer is formed of Ag or Al with excellent light reflectivity, a bonding layer is positioned under the reflective layer to reduce contact resistance, and a protective layer is positioned over the reflective layer so that a deterioration phenomenon is prevented, thereby simultaneously satisfying low contact resistance, high light reflectivity and high thermal stability; and a semiconductor light emitting element using the ohmic electrode.

According to an aspect of the present invention for achieving the objects, there is provided a method of forming an ohmic electrode in a semiconductor light emitting element, comprising: forming a semiconductor layer having a light emitting structure on a substrate; sequentially laminating a bonding layer, a reflective layer and a protective layer on the semiconductor layer; and forming an ohmic electrode by performing a heat treatment process to from ohmic bonding between the semiconductor layer and the bonding layer and to form an oxide film on at least a portion of the protective layer.

When forming the ohmic electrode, an oxide film may be formed on at least a portion of the bonding layer in the heat treatment process.

The bonding layer may include one selected from the group consisting of Ni, Pt, Pd, Ir, Ru, Mo, Rh, Os, Re, W, Ta, Tl, Hf, Cr, Co, Nb, Pb and alloys including at least one of the foregoing. Alternatively, the bonding layer may include one selected from the group consisting of Cu, In, Mg, Zn, Sb, Sn, Li, Be, B, Al, Ca, Sr, Ba and alloys including at least one of the foregoing.

The reflective layer may include one of Ag, Al and alloys including at least one of the foregoing.

The protective layer may include Mg, or Mg alloy including one selected from the group consisting of Al, Ag, Zr, Zn, Y, U, Ti, Ti, Sn, Si, Sc, Sb, Pu, Pb, Pr, Ni, Na, Mn and mixtures thereof.

The heat treatment process may be performed at a temperature of 200 to 500° C. within 30 minutes.

The heat treatment process may be performed under an oxygen containing atmosphere.

The oxygen containing atmosphere may be any one of an oxygen atmosphere, an oxygen-nitrogen mixture atmosphere, and an oxygen-argon mixture atmosphere.

Pressure of the oxygen containing atmosphere may be atmospheric pressure or less.

According to another aspect of the present invention for achieving the objects, there is provided a semiconductor light emitting element, comprising: a semiconductor layer having a light emitting structure; and an ohmic electrode including a bonding layer, a reflective layer and a protective layer sequentially laminated on the semiconductor layer, wherein ohmic bonding is formed between the bonding layer and the semiconductor layer, and the protective layer includes an oxide film formed on at least a portion of the protective layer.

The bonding layer may include an oxide film formed on at least a portion of the bonding layer.

The bonding layer may include one selected from the group consisting of Ni, Pt, Pd, Ir, Ru, Mo, Rh, Os, Re, W, Ta, Tl, Hf, Cr, Co, Nb, Pb and alloys including at least one of the foregoing. Alternatively, the bonding layer may include one selected from the group consisting of Cu, In, Mg, Zn, Sb, Sn, Li, Be, B, Al, Ca, Sr, Ba and alloys at least one of the foregoing.

The reflective layer may include one of Ag, Al and an alloy including at least one of the foregoing.

The protective layer may include Mg, or Mg alloy including one selected from the group consisting of Al, Ag, Zr, Zn, Y, U, Tl, Ti, Sn, Si, Sc, Sb, Pu, Pb, Pr, Ni, Na, Mn and mixtures thereof.

As described above, according to the present invention, an ohmic electrode is formed by laminating a bonding layer, a reflective layer and a protective layer, heat treating them to form oxide films on the bonding layer and the protective layer, and suppressing the external diffusion of the reflective layer through the oxide films. Accordingly, the following effects can be expected.

First of all, since a reflective layer is formed of Ag, Al or an alloy including at least one of the foregoing with excellent light reflectivity, the light availability is enhanced. Further, since contact resistance between a semiconductor layer and a bonding layer is small, it is easy to apply large current for high power. Furthermore, since a protective layer suppresses the external diffusion of the reflective layer, thermal stability is increased. In addition, since high power is possible without using an expensive metal such as Au or Pt, the fabrication cost is reduced.

BRIEF DESCRIPTION OF THE DRAWINGS

FIGS. 1 to 3 are sectional views illustrating a method of forming an ohmic electrode according to a first embodiment of the present invention;

FIG. 4 is a graph showing analysis results of a depth profile through a secondary ion-mass spectroscopy (SIMS) after heat treatment of an ohmic electrode according to an experimental example of the present invention;

FIG. 5 is a graph showing current-voltage characteristics of ohmic electrodes according to experimental examples of the present invention and a comparative example;

FIG. 6 is a graph illustrating light reflexibility characteristics of ohmic electrodes according to the experimental example of the present invention and a comparative example;

FIG. 7 is a scanning electron microstructure showing surface morphology of ohmic electrodes according to the experimental example of the present invention and the comparative example;

FIG. 8 is a sectional view showing a semiconductor light emitting element with a flip-chip structure according to a second embodiment of the present invention;

FIG. 9 is a sectional view showing a semiconductor light emitting element with a vertical structure according to a third embodiment of the present invention; and FIG. 10 is a graph showing a light emitting spectrum depending on a p-type electrode structure in the semiconductor light emitting element with a vertical structure according to the third embodiment of the present invention.

DETAILED DESCRIPTION OF THE ILLUSTRATED EMBODIMENTS

Hereinafter, preferred embodiments of the present invention will be described in detail with reference to the accompanying drawings. However, the present invention is not limited to the embodiments disclosed below but may be implemented into different forms. These embodiments are provided only for illustrative purposes and for full understanding of the scope of the present invention by those skilled in the art. Throughout the drawings, like reference numerals are used to designate like elements.

In the drawings, the thicknesses of layers and regions are exaggerated for clarity, and like reference numerals are used to designate like elements throughout the specification and drawings. Further, an expression that an element such as a layer, region, substrate or plate is placed "on" or "above" another element indicates not only a case where the element is placed "directly on" or "just above" the other element but also a case where a further element is interposed between the element and the other element.

FIGS. 1 to 3 are sectional views illustrating a method of forming an ohmic electrode according to a first embodiment of the present invention.

Referring to FIG. 1, if a substrate 10 is provided, a predetermined semiconductor layer 100 is formed thereon.

The substrate 10 may be SiC, Si, ZnO, GaAs or gallium phosphide (GaP) substrate. The sapphire substrate is more preferably used as the substrate.

The semiconductor layer 100 may be formed of films including one of Si, GaN, AlN, InGaN, AlGaN, AlInGaN and combinations including at least one of the foregoing. For example, in this embodiment, an n-type layer 110 is formed by implanting n-type dopants into a GaN film, an active layer 120 with a multiple quantum well structure is formed by alternately growing GaN films, as barrier layers, and InGaN films, as quantum well layers, on the n-type layer. And a p-type layer 130 is formed by growing a GaN film again and then implanting p-type dopants thereinto. At this time, a buffer layer (not shown) may be additionally formed between the substrate 10 and the n-type layer 110, wherein the buffer layer reduces the stress due to lattice mismatch between the substrate 10 and the n-type layer 110 thereby helping the n-type layer 110 to grow smoothly.

The semiconductor layer 100 may be surface treated in order to form a high-quality thin film and to enhance adhesive strength of an interface. Preferably, the surface treatment may be performed through a method in which the semiconductor layer 100 is dipped into an aqua regia solution ($HCl:H_2O=3:1$) for 1 to 30 minutes, cleansed with deionized water, and then dried with nitrogen. Further, the surface treatment may be performed through a method in which the semiconductor layer is dipped into a solution in which HCl and deionized water are mixed at a ratio of 1 to 1 for 10 to 100 seconds and then dried.

Referring to FIG. 2, a bonding layer 140, a reflective layer 150 and a protective layer 160 are laminated on the semiconductor layer 100.

The bonding layer 140 may include one selected from the group consisting of Ni, Pt, Pd, Ir, Ru, Mo, Rh, Os, Re, W, Ta, Tl, Hf, Cr, Co, Nb, Pb and alloys including at least one of the foregoing, or the group consisting of Cu, In, Mg, Zn, Sb, Sn, Li, Be, B, Al, Ca, Sr, Ba and alloys including at least one of the foregoing. The reflective layer 150 may include one of Ag, Al and an alloy including at least one of the foregoing. At this time, the Al alloy may include one of Ag, Zn, Si, Mg and an alloy thereof. The Ag alloy may include Al, Zn, Si, Mg and an alloy thereof. Further, the protective layer 160 may include Mg or Mg alloy. The Mg alloy may include one selected from the group consisting of Al, Ag, Zr, Zn, Y, U, Tl, Ti, Sn, Si, Sc, Sb, Pu, Pb, Pr, Ni, Na, Mn and combinations thereof. At this time, the bonding layer 140 may be formed to have a thickness of 1 to 500 nm. The reflective layer 150 is formed to have a thickness of 50 to 3,000 nm. The protective layer 160 is formed to have a thickness of 10 to 500 nm. Thereby, the total thickness of the layers is about 100 to 5,000 nm. For example, in this embodiment, the bonding layer is formed by depositing a Ni film to have a thickness of 10 nm, the reflective layer 150 is formed by depositing an Ag film to have a thickness of 200 nm, and the protective layer 160 is formed by depositing a Mg film to have a thickness of 50 nm.

Referring to FIG. 3, an ohmic electrode 200 has a $NiO_x$/Ag/$MgO_x$ structure formed by heat treating a Ni bonding layer 170, an Ag reflective layer 180 and a Mg protective layer 190.

The heat treatment process may be performed under any one of an oxygen atmosphere, an oxygen-nitrogen mixture atmosphere, and an oxygen-argon mixture atmosphere. Particularly, the heat treatment process may be performed at a temperature of 200 to 500° C. within 30 minutes. Since oxygen is supplied in such a heat treatment process, the Ni bonding layer 170 and the Mg protective layer 190 are oxidized, so that the ohmic electrode 200 is formed to have a structure in which the Ag reflective layer 180 is interposed between the oxide films, i.e., a $NiO_x$/Ag/$MgO_x$ structure.

At this time, since diffusion of Ga of the semiconductor layer 100 takes place easily due to a high solubility of Ga in $MgO_x$, a large number of Ga vacancies are generated in an interface between the semiconductor layer 100 and the ohmic electrode 200. The Ga vacancies serve as acceptors. Thus, the ohmic electrode 200 after the heat treatment has strong adhesive strength and low contact resistance. Further, the $MgO_x$ protective layer 190 prevents excessive introduction of oxygen and thus agglomeration of Ag. Therefore, since the interface flatness of Ag is not lowered, the ohmic electrode 200 has high reflectivity. In addition, since the $MgO_x$ protective layer 190 prevents the external diffusion of the substrate 10, the semiconductor layer 100 and the Ag reflective layer 180 during a subsequent heat treatment, the ohmic electrode 200 has excellent thermal stability.

In order to understand the characteristics of the ohmic electrode 200 according to this embodiment, experimental and comparative examples will be described below. As the experimental example, an ohmic electrode with a $NiO_x$/Ag/$MgO_x$ structure was used. The structure was formed by laminating Ni, Ag and Mg metal thin films on a semiconductor layer, i.e., a GaN layer, and then followed by heat treatment under an oxygen atmosphere.

FIG. 4 is a graph showing analysis results of a depth profile through a secondary ion-mass spectroscopy (SIMS) after heat treatment of an ohmic electrode according to the experimental example of the present invention. The ohmic electrode with a $NiO_x$/Ag/$MgO_x$ structure formed by heat treatment under an oxygen atmosphere at about 450° C. for 2 minutes is used as the experimental example.

Referring to FIG. 4, it can be seen that Ni in a bonding layer is changed into $NiO_x$, and Mg is changed into $MgO_x$ after the heat treatment to form the ohmic electrode with a $NiO_x$/Ag/$MgO_x$ structure. Here, the fact that Mg and O have similar distribution depending on the depth means that $MgO_x$ is formed. In addition, the fact that the external diffusion of Ga is very large means that a larger number of Ga vacancies may be generated in an interface between a semiconductor layer and the ohmic electrode. Since the Ga vacancies generated in this manner serve as accepters for producing holes, contact resistance between the semiconductor layer and the ohmic electrode is greatly reduced.

FIG. 5 is a graph showing current-voltage characteristics of ohmic electrodes according to experimental examples of the present invention and a comparative example. Lines A1 to A5 in the graph of FIG. 5 represents current-voltage characteristics of the ohmic electrodes with a $NiO_x$/Ag/$MgO_x$ structure at various heat treatment temperature according to the experimental examples. In addition, a line B represents a current-voltage characteristic of the ohmic electrode with a Ni/Au structure according to the comparative example.

Referring to FIG. 5, when comparing the lines A and B in the graph, it can be seen that the current-voltage characteristic of the ohmic electrodes according to the experimental examples are improved. Further, when the lines A1 to A5 are compared with one another, it can be seen that the current-voltage characteristic of the ohmic electrode, which is heat treated at about 400 to 500° C., is most excellent. In this case, the contact resistance is calculated as $8 \times 10^{-6}$ $\Omega cm^2$, which is a very small value.

FIG. 6 is a graph illustrating light reflectivity characteristics of ohmic electrodes according to the experimental example of the present invention and a comparative example. A line A in the graph of FIG. 6 represents light reflectivity of the ohmic electrode with a $NiO_x$/Ag/$MgO_x$ structure according to the experimental example, and a line B represents light reflectivity of the ohmic electrode with a Ni/Ag structure according to the comparative example.

Referring to FIG. 6, the multi-layered ohmic electrode according to the present experimental example shows a very high light reflectivity of 93% at a wavelength of 460 nm. On the other hand, the ohmic electrode according to the comparative example shows a low light reflectivity of 72%. Such a result of the present invention is a very significant numerical value close to 96% that is reflectivity of a mirror. This is because the interface voids and the agglomeration of Ag are prevented, and thus a high light reflectivity characteristic of Ag is maintained as it is.

FIG. 7 shows scanning election microphotographs of surface morphology of ohmic electrodes according to the experimental example of the present invention and the comparative example. FIG. 7 (a) shows a surface of the ohmic electrode with a Ni/Ag structure according to the comparative example, and FIG. 7 (b) shows a surface of the ohmic electrode with a $NiO_x$/Ag/$MgO_x$ structure according to the experimental example.

Referring to FIG. 7 (a), a surface of the ohmic electrode according to the comparative example shows an uneven surface state due to agglomeration and interface voids. On the other hand, referring to FIG. 7 (b), a surface of the ohmic electrode according to the experimental example shows a very smooth surface state. This is because $MgO_x$ formed on the surface prevents oxygen from being excessively introduced into an Ag reflective layer during the surface treatment and thus agglomeration of Ag and interface voids are suppressed.

As such, the ohmic electrode 200 according to the present invention can have low contact resistance and high light reflectivity simultaneously and is excellent in thermal stability. Accordingly, the ohmic electrode can be appropriately used in a structure capable of emitting high power light through the application of large current, i.e., a semiconductor light emitting element with a flip-chip or vertical structure. In this case, an excellent light emitting characteristic can be expected.

Hereinafter, a high power semiconductor light emitting element using the ohmic electrode will be described.

FIG. 8 is a sectional view showing a semiconductor light emitting element with a flip-chip structure according to a second embodiment of the present invention.

Referring to FIG. 8, the semiconductor light emitting element includes a semiconductor layer 210 with a multi-layered structure having an n-type layer 110, an active layer 120 and a p-type layer 130. The semiconductor light emitting element also includes an n-type electrode 220 formed in a predetermined region of the n-type layer 110; a p-type electrode 230 formed on top of the p-type layer 130; a submount substrate 240 connected to the two electrodes 220 and 230 using bumps 241 and 242; and a current diffusion layer 250 formed under the n-type layer 110.

The n-type layer 110, the active layer 120 and the p-type layer 130 may be formed, respectively, by depositing layers including one selected from the group consisting of Si, GaN, AlN, InGaN, AlGaN, AlInGaN and combinations at least one of the foregoing. Each of the n-type and p-type layers 110 and 130 is formed by implanting n-type or p-type dopants into the semiconductor thin film. At this time, Mg, Zn, Be, Ca, Sr, Ba or the like may be used as the p-type dopant, and Si, Ge, Se, Te, C or the like may be used as the n-type dopant. The active layer 120, which is a multi-layered semiconductor thin film having a single or multiple quantum well structure formed by alternately laminating quantum well layers and barrier layers, serves as a light emitting layer for outputting light with a predetermined wavelength. In this embodiment, the n-type layer 110 may be formed by growing a GaN thin film and then implanting n-type dopants thereinto. The active layer 120 with a multiple well structure may be formed by alternately growing GaN thin films that are barrier layers and InGaN thin films that are quantum well layers on the n-type layer. And the p-type layer 130 may be formed by growing a GaN thin film again on the active layer and then implanting p-type dopants thereinto.

The n-type electrode 220 may include one selected from the group consisting of Pb, Sn, Au, Ge, Cu, Bi, Cd, Zn, Ag, Ni, Ti and alloys including at least one of the foregoing. It will be apparent that the n-type electrode 220 may include a multi-layered metal film.

The p-type electrode 230 includes a bonding layer 170, a reflective layer 180 and a protective layer 190. That is, an ohmic electrode described in the previous embodiment may be used. Accordingly, the adhesive strength between the p-type layer 130 and the bonding layer 170 is enhanced, and the excellent light reflectivity of the reflective layer 180 is maintained, thereby maximizing the light efficiency. Further, the reflective layer 180 is protected by being covered by the protective layer 190, so that the reflective layer 180 can be prevented from being deteriorated due to heat generated in a subsequent heat treatment process or operation process.

Since the current diffusion layer 250 allows the current applied to the n-type electrode 220 to be uniformly diffused and allows the heat transmitted through the n-type layer 110 to be effectively radiated, the operational reliability of the semiconductor light emitting element is increased.

A method of fabricating the semiconductor light emitting element with such a configuration will be described as follows.

An n-type layer 110, an active layer 120 and a p-type layer 130 are sequentially laminated on a mother substrate (not shown), and then divided into individual cells by performing a patterning process using a predetermined mask. Subsequently, if a bonding layer 170, a reflective layer 180 and a protective layer 190 are additionally laminated on the p-type layer 130 and then heat treated under an oxygen atmosphere, the external diffusion of the reflective layer 180 is suppressed due to oxide films formed over and under the reflective layer, thereby forming a p-type electrode 230 with low contact resistance and high light reflectivity. Thereafter, the mother substrate is removed by performing a lift-off process using an excimer laser, and a diffusion layer 250 is formed under the mother substrate. At this time, since the diffusion layer 250 allows the applied current to be diffused into the n-type layer 110 and is a portion of a light exit surface through which produced light is emitted, it is preferred that the diffusion layer be formed of a material with excellent conductivity and transmissivity. Then, the two electrodes 220 and 230 are connected to a submount substrate 240 using bumps 241 and 242, so that the semiconductor light emitting element with the aforementioned structure can be fabricated.

A process of operating the semiconductor light emitting element with such a configuration will be described as follows.

If power is applied to the two electrodes 220 and 230, holes and electrons are injected into the active layer 120 from the p-type layer 130 and from the n-type layer 110, respectively. The holes and electrons injected into the active layer 120 emit excitation energy as light while being combined or recombined with each other, and then, the light is emitted to the outside through the diffusion layer 250 that is a light exit surface. At this time, light emitted to the upside of the active layer, i.e., the p-type layer 130, is reflected by the p-type electrode 230 having the reflective layer 180 and then emitted to the outside through the light exit surface 250.

FIG. 9 is a sectional view showing a semiconductor light emitting element with a vertical structure according to a third embodiment of the present invention.

Referring to FIG. 9, the semiconductor light emitting element includes a semiconductor layer 310 with a multi-layered structure having an n-type layer 110, an active layer 120 and a p-type layer 130. The semiconductor light emitting element also includes an n-type electrode 320 formed on the n-type layer 110, and a p-type electrode 330 formed under the p-type layer 130. Here, the p-type electrode 330 includes a bonding layer 170, a semiconductor layer 180 and a protective layer 190. That is, it is preferred to use the ohmic electrode described in the previous embodiment.

A method of fabricating the semiconductor light emitting element with such a configuration will be described as follows.

An n-type layer 110, an active layer 120 and a p-type layer 130 are sequentially laminated on a mother substrate (not shown) to form a semiconductor layer 310 with a multi-layered structure, and they are then divided into individual cells by performing a patterning process using a predetermined mask. Subsequently, if a bonding layer 170, a reflective layer 180 and a protective layer 190 are additionally laminated on the p-type layer 130 and then heat treated under an oxygen atmosphere, the external diffusion of the reflective layer 180 is suppressed due to oxide films formed over and under the reflective layer, thereby forming a p-type electrode 330 with low contact resistance and a high light reflectivity. Thereafter, a lift-off process for separating the mother substrate attached to the n-type layer 110 therefrom is performed by irradiating a lower portion of the mother substrate with an excimer laser and an n-type electrode 320 is formed on the n-type layer 110 from which the mother substrate is removed, whereby the semiconductor light emitting element with the aforementioned structure can be fabricated.

As described above, an ohmic electrode according to the present invention is formed by laminating a bonding layer, a reflective layer and a protective layer and then heat treating them to form oxide films on the bonding layer and the protective layer and to suppress the external diffusion of the reflective layer through the oxide film. Further, the bonding layer reduces the contact resistance with a semiconductor layer. Accordingly, Ag and Al with excellent reflectivity can be used and thus light availability is enhanced, so that the light output of the semiconductor light emitting element can be enhanced.

FIG. 10 is a graph showing a light emitting spectrum depending on a p-type electrode structure in the semiconductor light emitting element with a vertical structure according to the third embodiment of the present invention. A line A in FIG. 10 shows the case where $NiO_x/Ag/MgO_x$ is used as the p-type electrode according to the present invention, and a line B in FIG. 10 shows the case where Ni/Au is used as the p-type electrode according to the comparative example to the present invention.

Referring to FIG. 10, when $NiO_x/Ag/MgO_x$ is used as the p-type electrode, it can be seen that the light intensity is increased about 2.5 to 3 times as much as that of the comparative example where Ni/Au is used as the p-type electrode. Further, in the case of a semiconductor light emitting element with a vertical structure according to this embodiment, the operation voltage of the element at an applied current of 20 mA is 3.1V which is very low. Meanwhile, although Ni, Ag and Mg are used as a bonding layer, a reflective layer and a protective layer, respectively, in the graph according to the experimental example, the similar results can also be obtained even when using other metals indicated in the aforementioned embodiment.

Meanwhile, an ohmic electrode with a $NiO_x/Ag/MgO_x$ structure in which oxide films are formed over and under an Ag reflective layer has been described in the aforementioned first, second and third embodiments. However, since the oxide films may be formed on portions of a Ni bonding layer and a Mg protective layer depending on a heat treatment condition, the ohmic electrode of the present invention may include both $Ni/NiO_x/Ag/MgO_x$ and $NiO_x/Ag/Mg/MgO_x$ structures. In this case, a similar effect can also be expected.

Although the present invention has been described with reference to the aforementioned embodiments and the accompanying drawings, the present invention is not limited thereto but defined by the appended claims. Accordingly, it will be understood by those skilled in the art that various modifications and changes can be made thereto within the scope of the invention without departing from the spirit of the claims.

The invention claimed is:

1. A method of forming an ohmic electrode in a semiconductor light emitting element, comprising:
   forming a semiconductor layer having a light emitting structure on a substrate;
   sequentially laminating a bonding layer, a reflective layer and a protective layer on the semiconductor layer; and
   forming an ohmic electrode by performing a heat treatment process to form ohmic bonding between the semiconductor layer and the bonding layer and to form an oxide film on at least a portion of the protective layer,
   wherein the protective layer comprises Mg, or Mg alloy comprising one selected from the group consisting of Al, Ag, Zr, Zn, Y, U, TI, Ti, Sn, Si, Sc, Sb, Pu, Pb, Pr, Ni, Na, Mn and mixtures thereof.

2. The method as claimed in claim 1, wherein an oxide film is formed on at least a portion of the bonding layer in the heat treatment process, when forming the ohmic electrode.

3. The method as claimed in claim 1, wherein the bonding layer comprises one selected from the group consisting of Ni, Pt, Pd, Ir, Ru, Mo, Rh, Os, Re, W, Ta, TI, Hf, Cr, Co, Nb, Pb and alloys comprising at least one of the foregoing.

4. The method as claimed in claim 1, wherein the bonding layer comprises one selected from the group consisting of Cu, In, Mg, Zn, Sb, Sn, Li, Be, B, Al, Ca, Sr, Ba and alloys comprising at least one of the foregoing.

5. The method as claimed in claim 1, wherein the reflective layer comprises one of Ag, Al and alloys comprising at least one of the foregoing.

6. The method as claimed in claim 1, wherein the heat treatment process is performed at a temperature of 200 to 500° C. within 30 minutes.

7. The method as claimed in claim 6, wherein the heat treatment process is performed under an oxygen containing atmosphere.

8. The method as claimed in claim 7, wherein the oxygen containing atmosphere is any one of an oxygen atmosphere, an oxygen-nitrogen mixture atmosphere, and an oxygen-argon mixture atmosphere.

9. The method as claimed in claim 7, wherein pressure of the oxygen containing atmosphere is atmospheric pressure or less.

10. A method of forming an ohmic electrode in a semiconductor light emitting element, comprising: forming a semiconductor layer having a light emitting structure on a substrate; sequentially laminating a bonding layer, a reflective layer and a protective layer on the semiconductor layer; and forming an ohmic electrode by performing a heat treatment process to form ohmic bonding between the semiconductor layer and the bonding layer and to form an oxide film on at least a portion of the protective layer, wherein the reflective layer is disposed directly on the bonding layer, and the protective layer is disposed directly on the reflective layer; wherein the protective layer comprises Mg, or Mg alloy comprising one selected from the group consisting of Al, Ag, Zr, Zn, Y, U, TI, Ti, Sn, Si, Sc, Sb, Pu, Pb, Pr, Ni, Na, Mn and mixtures thereof.

11. The method as claimed in claim 10, wherein an oxide film is formed on at least a portion of the bonding layer in the heat treatment process, when forming the ohmic electrode.

12. The method as claimed in claim 10, wherein the bonding layer comprises one selected from the group consisting of Ni, Pt, Pd, Ir, Ru, Mo, Rh, Os, Re, W, Ta, TI, Hf, Cr, Co, Nb, Pb and alloys comprising at least one of the foregoing.

13. The method as claimed in claim 10, wherein the bonding layer comprises one selected from the group consisting of Cu, In, Mg, Zn, Sb, Sn, Li, Be, B, Al, Ca, Sr, Ba and alloys comprising at least one of the foregoing.

14. The method as claimed in claim 10, wherein the reflective layer comprises one of Ag, Al and alloys comprising at least one of the foregoing.

15. The method as claimed in claim 10, wherein the heat treatment process is performed at a temperature of 200 to 500° C. within 30 minutes.

16. The method as claimed in claim 15, wherein the heat treatment process is performed under an oxygen containing atmosphere.

17. The method as claimed in claim 16, wherein the oxygen containing atmosphere is any one of an oxygen atmosphere, an oxygen-nitrogen mixture atmosphere, and an oxygen-argon mixture atmosphere.

18. The method as claimed in claim 16, wherein pressure of the oxygen containing atmosphere is atmospheric pressure or less.

* * * * *

UNITED STATES PATENT AND TRADEMARK OFFICE
CERTIFICATE OF CORRECTION

| | | |
|---|---|---|
| PATENT NO. | : 8,263,997 B2 | Page 1 of 1 |
| APPLICATION NO. | : 12/296356 | |
| DATED | : September 11, 2012 | |
| INVENTOR(S) | : Lee | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 806 days.

Signed and Sealed this
Twenty-ninth Day of December, 2015

Michelle K. Lee
*Director of the United States Patent and Trademark Office*